United States Patent
Kodama et al.

(10) Patent No.: US 8,715,415 B2
(45) Date of Patent: May 6, 2014

(54) VITREOUS SILICA CRUCIBLE FOR PULLING SILICON SINGLE CRYSTAL

(75) Inventors: Makiko Kodama, Akita (JP); Hiroshi Kishi, Akita (JP); Minoru Kanda, Akita (JP)

(73) Assignee: Japan Super Quartz Corporation, Akita (JP)

( * ) Notice: Subject to any disclaimer, the term of this patent is extended or adjusted under 35 U.S.C. 154(b) by 1044 days.

(21) Appl. No.: 12/752,374

(22) Filed: Apr. 1, 2010

(65) Prior Publication Data

US 2010/0251959 A1    Oct. 7, 2010

(30) Foreign Application Priority Data

Apr. 2, 2009    (JP) .................................. 2009-090518

(51) Int. Cl.
*C30B 15/10*    (2006.01)

(52) U.S. Cl.
USPC ............... 117/200; 117/201; 117/15; 117/13; 117/18

(58) Field of Classification Search
USPC .................. 117/13, 15, 18, 200, 201
See application file for complete search history.

(56) References Cited

U.S. PATENT DOCUMENTS

| | | |
|---|---|---|
| 4,935,046 A | 6/1990 | Uchikawa et al. |
| 4,956,208 A | 9/1990 | Uchikawa et al. |
| 5,989,021 A | 11/1999 | Sato et al. |
| 6,136,092 A | 10/2000 | Sato et al. |
| 6,553,787 B1 | 4/2003 | Akiho et al. |
| 2007/0051296 A1 | 3/2007 | Kemmochi et al. |
| 2007/0051297 A1 | 3/2007 | Kemmochi et al. |
| 2009/0151624 A1 | 6/2009 | Shimazu |
| 2009/0165701 A1 | 7/2009 | Kishi et al. |
| 2010/0071613 A1* | 3/2010 | Kishi et al. ..................... 117/208 |

FOREIGN PATENT DOCUMENTS

| | | |
|---|---|---|
| EP | 0319031 | 6/1989 |
| EP | 1094039 | 4/2001 |
| EP | 1762549 | 3/2007 |
| JP | 1-197381 | 8/1989 |
| JP | 1-261293 | 10/1989 |
| JP | 6-191986 | 7/1994 |

* cited by examiner

*Primary Examiner* — Bob M Kunemund
(74) *Attorney, Agent, or Firm* — Greenblum & Bernstein, P.L.C.

(57) ABSTRACT

Provided is a vitreous silica crucible for pulling silicon single crystals, which can melt a silicon raw material in a short time and improve production yield of silicon single crystals by temporal change of an opaque vitreous silica layer. The vitreous silica crucible includes an opaque vitreous silica layer (11) provided on an outer surface thereof and containing plural bubbles, and a transparent vitreous silica layer(12) provided on an inner surface and not containing bubbles substantially. The opaque vitreous silica layer(11) has a bubble diameter distribution in which the content of bubbles having a diameter of less than 40 μm is 10% or more and less than 30%, the content of bubbles having a diameter of 40 μm or more and less than 90 μm is 40% or more and less than 80%, and the content of bubbles having a diameter equal to or more than 90 μm is 10% or more and less than 30%. Relatively small bubbles contained in the opaque vitreous silica layer(11) contribute to the thermal conductivity of a crucible at an initial pulling stage, and relatively large bubbles contained in the opaque vitreous silica layer are expanded through a long-term pulling process to thereby largely contribute to the warmth retaining property of the crucible at a later pulling stage.

5 Claims, 4 Drawing Sheets

VITREOUS SILICA CRUCIBLE FOR PULLING SILICON SINGLE CRYSTAL

CROSS-REFERENCE TO RELATED APPLICATION

This application claims priority to Japanese Patent Application No. 2009-090518 filed on Apr. 2, 2009 and all the benefits accruing therefrom under 35 U.S.C. §119, the contents of which are incorporated by reference in their entirety.

BACKGROUND

The present disclosure relates to a vitreous silica crucible for pulling silicon single crystals, and more particularly, to a structure of an opaque vitreous silica layer in a vitreous silica crucible.

A vitreous silica crucible is used to manufacture silicon single crystals. In Czochralski method (CZ method), polysilicon is put into a vitreous silica crucible, heated and melted to prepare a silicon melt, a seed crystal is then dipped into the silicon melt, and a silicon single crystal grows by gradually pulling up the seed crystal while rotating the crucible. To manufacture high-purity silicon single crystals for semiconductor devices, it is required that silicon single crystals should not be contaminated due to elution of impurities contained in a vitreous silica crucible, and the vitreous silica crucible should also have a heat capacity enough to easily control the temperature of a silicon melt therein. For this reason, a vitreous silica crucible having a double-layered structure is being popularly used, which is configured with an opaque outer layer containing a plurality of micro-bubbles and a transparent inner layer not containing a bubble (see Patent Document 1). Also, another vitreous silica crucible having a double-layered structure is in use, in which an outer layer of the crucible is formed of natural quartz to increase the strength of the crucible and an inner layer of the crucible contacting a silicon melt is formed of synthetic silica to substantially reduce the inclusion of impurities (see Patent Document 2). To increase single crystallization rate, yet another vitreous silica crucible was also proposed, in which a bubble content of a transparent glass layer at a sidewall part is set to 0.5% or less and a bubble content of a transparent glass layer at a bottom part is further reduced to 0.01% or less (see Patent Document 3).

PRIOR ART DOCUMENTS

Patent Documents

[Patent Document 1] Japanese Patent Application Laid-Open No. Hei 1-197381
[Patent Document 1] Japanese Patent Application Laid-Open No. Hei 1-261293
[Patent Document 1] Japanese Patent Application Laid-Open No. Hei 6-191986

A related art vitreous silica crucible has a structure that allows bubbles in an opaque vitreous silica glass to be nearly uniform in diameter and a bubble content to be converged as constantly as possible. However, according to this structure, an infrared transmittance (thermal conductivity) is low at an initial stage of pulling silicon single crystal, and accordingly it takes much time for a silicon raw material to be melted in the crucible. Furthermore, since the infrared transmittance becomes relatively higher at a later stage of pulling silicon single crystal, heat may be easily dissipated, warmth retaining property is insufficient, and thus temperature control of a reduced silicon melt is difficult. When the temperature of the silicon melt is unstable, the production yield of silicon single crystals is decreased.

SUMMARY

The present disclosure provides a vitreous silica crucible used for pulling silicon single crystal, which can allow a silicon raw material to be melted in a short time and improve production yield of silicon single crystals by a temporal change of an opaque vitreous silica layer.

In accordance with an exemplary embodiment, a vitreous silica crucible having a sidewall part, a curved part and a bottom part, for pulling silicon single crystals, the vitreous silica crucible including: a transparent vitreous silica layer provided on an inner surface of the crucible; and an opaque vitreous silica layer provided on an outer surface of the crucible, and including a plurality of bubbles. Herein, a bubble content of the transparent vitreous silica layer is 0.1% or less and the opaque vitreous silica layer is higher in bubble content than the transparent vitreous silica layer, and the opaque vitreous silica layer has a bubble diameter distribution in which the content of bubbles having a diameter of less than 40 µm is 10% or more and less than 30%, the content of bubbles having a diameter of 40 µm or more and less than 90 µm is 40% or more and less than 80%, and the content of bubbles having a diameter equal to or more than 90 µm is 10% or more and less than 30%.

In accordance with exemplary embodiments, relatively small bubbles contained in the opaque vitreous silica layer contribute to the thermal conductivity of a crucible at an initial pulling stage, and relatively large bubbles contained in the opaque vitreous silica layer are expanded through a long-term pulling process to thereby largely contribute to the warmth retaining property of the crucible at a later pulling stage. That is, at the initial stage of pulling silicon single crystal when a large amount of a silicon melt exists in the crucible, the crucible may have such a characteristic that the infrared transmittance is high and very susceptible to heat input. At the later stage of pulling silicon single crystal when the amount of the silicon melt is reduced, the vitreous silica crucible may have a characteristic that its warmth retaining property is enhanced.

In exemplary embodiments, the opaque vitreous silica layer may have a bubble diameter distribution in which a diameter difference between bubbles having a diameter less than 40 µm and bubbles having a diameter equal to or greater than 90 µm is less than 10%, desirably less than 5%. If the diameter difference is less than 10%, the balance between the small bubbles and large bubbles is good, and it is thus possible to provide a crucible excellent in both of heat-inputting property at the initial pulling stage and warmth retaining property at the later pulling stage. Moreover, if the diameter difference is less than 5%, the crucible which is more excellent in both of heat-inputting property and warmth retaining property may be provided.

In exemplary embodiments, the opaque vitreous silica layer at an upper part of the crucible may have more large-diameter bubbles and a higher bubble content than the opaque vitreous silica layer at a lower part of the crucible. In exemplary embodiments, the opaque vitreous silica layer at the sidewall part of the crucible may have more large-diameter bubbles and a higher bubble content than the opaque vitreous silica layer at the bottom part of the crucible. In exemplary embodiments, the opaque vitreous silica layer may have a bubble diameter distribution in which the number of large-diameter bubbles increases from the bottom part toward the sidewall part, and may have a bubble content increasing from the bottom part toward the sidewall part.

In any configurations as illustrated above, it is possible to allow the upper part of the crucible to have less weight and also possible to substantially reduce deformation such as crookedness or buckling because the opaque vitreous silica layer contains a plurality of large-diameter bubbles.

BRIEF DESCRIPTION OF THE DRAWINGS

Exemplary embodiments can be understood in more detail from the following description taken in conjunction with the accompanying drawings, in which:

FIGS. 4(a) to 4(d) are graphs showing bubble diameter distributions of an opaque vitreous silica layer(11), in which

DETAILED DESCRIPTION OF EMBODIMENTS

Hereinafter, exemplary embodiments will be described in detail with reference to the accompanying drawings.

Figure 1:
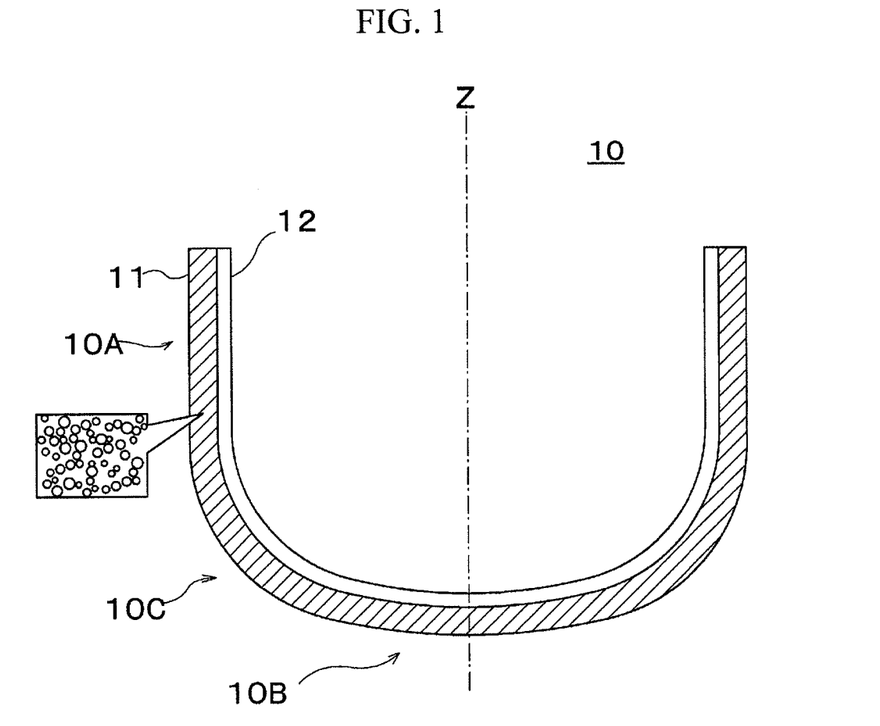
FIG. 1 is a schematic sectional view illustrating a structure of a vitreous silica crucible for pulling silicon single crystals in accordance with an exemplary embodiment.

FIG. 1 is a schematic sectional view illustrating a structure of a vitreous silica crucible for pulling silicon single crystals in accordance with an exemplary embodiment.

As illustrated in FIG. 1, a vitreous silica crucible 10 in accordance with the current embodiment has a double-layered structure, and includes an opaque vitreous silica layer 11 constituting an outer layer, and a transparent vitreous silica layer 12 constituting an inner layer.

The opaque vitreous silica layer 11 is an amorphous vitreous silica layer containing a plurality of micro-bubbles. Herein, the term ⌊opaque⌋ means that many bubbles exist in vitreous silica so that the vitreous silica appears white and dim. The opaque vitreous silica layer 11 plays a role in transferring heat generated by a heater disposed around the crucible to a silicon melt in the vitreous silica crucible uniformly. The opaque vitreous silica layer 11 may easily control a temperature of the silicon melt because the opaque vitreous silica layer 11 is higher in heat capacity than the transparent vitreous silica layer 12.

A bubble content of the opaque vitreous silica layer 11 is greater than that of the transparent vitreous silica layer 12. A range of the bubble content of the opaque vitreous silica layer 11 enabling required functions to be performed is not specifically limited, however, the bubble content of the opaque vitreous silica layer 11 may be greater than 0.1% but not exceeding 5.0%. This is because, if the bubble content is 0.1% or less, the opaque vitreous silica layer 11 does not perform its function and a warmth retaining property is insufficient at a first-half pulling stage, and, if the bubble content of the opaque vitreous silica layer 11 exceeds 5.0%, the crucible may be easily deformed due to expansion of bubbles and the thermal conductivity is more insufficient at the first-half pulling stage due to the possibility of a decrease in single crystallization rate. The bubble content of the opaque vitreous silica layer 11 may be in the range of 1.0% to 4.0%. If the bubble content ranges from 1.0% to 4.0%, the deformation of the crucible may be further reduced and the thermal conductivity at the first-half pulling stage may be further increased. The bubble content of the opaque vitreous silica layer may be calculated by measuring the specific gravity. Given that the mass of an opaque vitreous silica piece of a unit volume (1 cm$^3$) cut from the crucible is denote as A, and the specific gravity of vitreous silica not containing a bubble is denoted as B (2.21 g/cm$^3$), the bubble content (P) may be expressed as Equation, $P(\%)=(1-A/B)\times 100$.

The opaque vitreous silica layer 11 may be comprised of a natural quartz glass. The natural quartz glass is vitreous silica obtained by melting a natural raw material such as natural quartz and silica. In general, the natural quartz is higher in metal impurity concentration but lower in hydroxyl group (OH) concentration than synthetic silica. In natural quartz, for example, the content of Al is 1 ppm or more, the contents of alkaline metals (Na, K and Li) are 0.05 ppm or more, respectively, and the content of OH group is less than 60 ppm. The determination of natural quartz should not be made on the basis of one factor but should be determined overall based on plural factors. Since natural quartz is higher in viscosity than synthetic silica at a high temperature, the natural quartz allows a heat resistance of the entire crucible to be increased. Also, a natural raw material is cheaper than synthetic silica, and thus it is advantageous in terms of manufacturing cost.

The transparent vitreous silica layer 12 is an amorphous vitreous silica layer which does not contain bubbles substantially, and differs in appearance from the opaque vitreous silica layer 11. The transparent vitreous silica layer 12 may substantially reduce the increase of quartz pieces delaminated from an inner surface of the crucible, and increase silicon single crystallization rate. Here, the term ⌊transparent vitreous silica layer 12 does not contain bubbles substantially⌋ means the transparent vitreous silica layer 12 has a bubble content and bubble size not to allow single crystallization rate to be decreased due to the presence of bubbles. Although not specifically limited, it can be regarded that bubbles are not substantially contained if the bubble content is 0.1% or less and an average bubble diameter is 100 μm or less. A variation of a bubble content from the transparent vitreous silica layer 12 to the opaque vitreous silica layer 11 is relatively sharp, and therefore, the bubble content sharply increases to reach that of the opaque vitreous silica layer 11 at a position toward the outer layer of the crucible, at a distance 30 μm from a position at which the bubble content of the transparent vitreous silica layer 12 begins to increase. Accordingly, an interface between the opaque vitreous silica layer 11 and the transparent vitreous silica layer 12 is clearly distinguished with the naked eyes.

The bubble content of the transparent vitreous silica layer may be nondestructively measured using an optical detection apparatus. The optical detection apparatus includes a light-receiving unit configured to receive reflection light of light irradiated on the inner surface and a portion around the inner surface of the vitreous silica crucible to be detected. A light-emitting unit for irradiating light may be built in or employ an external light-emitting unit. Also, the optical detection apparatus may be rotatably operated along the inner surface of the vitreous silica crucible. The irradiation light may be X-ray or laser as well as visible light, ultraviolet light and infrared light, and may also use any light that can be reflected and used for detection of bubbles. The light-receiving unit is selected according to a type of the irradiation light, and, for example, may include an optical camera provided with a light-receiving lens and a capturing module. To detect bubbles existing at a predetermined depth from the surface, the focus of the optical lens may be scanned toward a depth direction from the surface.

The result measured by the optical detection apparatus is received at an image processing apparatus, and a bubble content is then calculated. In detail, an image of the inner surface of the crucible is captured using an optical camera, the inner surface of the crucible is uniformly divided into predetermined areas to define a reference area as S1, and the bubble content (P) is calculated from Equation, P(%)=(S2/S1)×100, after calculating a occupation area S2 of bubbles in each reference area S1. Such a nondestructively-measuring method of the bubble content is disclosed in detail, for example, in Japanese Patent Application Laid-Open No. Hei 3-86249 and Japanese Patent Application Laid-Open No. Hei 11-228283.

The transparent vitreous silica layer 12 may be made of synthetic fused silica. The synthetic fused silica means, for example, vitreous silica prepared by fusing a raw material synthesized by hydrolysis of silicon alkoxide. In general, the synthetic silica is lower in metal impurity concentration but higher in OH group concentration than natural quartz. For example, the content of each metal impurity included in the synthetic silica is less than 0.05 ppm, and the content of OH group is 30 ppm or more. However, since synthetic silica with a metal impurity such as aluminum (Al) added has also been known, the determination of synthetic silica is not made on the basis of one factor, but made overall based on plural factors. Because the synthetic fused silica has smaller impurity than natural quartz glass, it is possible to substantially reduce the increase of impurities eluted from the crucible to the silicon melt, thereby increasing silicon single crystallization rate.

Both of the opaque and transparent vitreous silica layers 11 and 12 are formed an entire surface from a sidewall part 10A to a bottom part 10B of the crucible. The sidewall part 10A of the crucible is a barrel-shaped part that is parallel to the center axis (Z-axis), and extends from an opening of the crucible toward the bottom. However, the sidewall part 10A may not be perfectly parallel to the Z-axis, and thus may be inclined in such a shape that a diameter of the cylinder gradually increases toward the opening. Also, the sidewall part 10A may be linear, or smoothly curved. Although not specifically limited, the sidewall part 10A may be defined as an area of which a tilt angle of a tangential line of the crucible wall with respect to the XY-plane normal to the Z-axis is 80 degrees or more.

The bottom part 10B of the crucible is a nearly disk-shaped portion including an intersection point with the Z-axis of the crucible, and a curved part 10C is formed between the bottom part 10B and the sidewall part 10A. The bottom part 10B should cover at least a projection plane of a silicon single crystal that is being pulled up. The bottom part 10B of the crucible may have a spherical shape or a planar shape. Also, a curvature or angle of the curved part 10C may be set to a desired value. In the case where the bottom part 10B of the crucible has a spherical shape, the bottom part 10B also has a certain curvature and thus a curvature difference between the bottom part 10B and the curved part 10C is very small in comparison with the plane-shaped bottom part 10B. In the case where the bottom part 10B of the crucible is plane-shaped, the bottom part 10B is flat or very gently curved so that the curved part 10C has a large curvature. Furthermore, in the plane-shaped bottom part 10B, the bottom part 10B may be defined as an area of which a tilt angle of a tangential line of the crucible wall with respect to the XY-plane normal to the Z-axis is 30 degrees or less.

The thickness of the crucible may be 10 mm or more, preferably 13 mm or more. Typically, a thickness of a large-diameter crucible having a diameter of 32 inches (approximately 800 mm) or more may be 10 mm or more, and a thickness of a large-diameter crucible having a diameter of 40 inches (approximately 1,000 mm) or more may be 13 mm or more. Such a large-diameter crucible makes it very difficult to control a temperature of a silicon melt due to its large capacity, and the effect achieved by the present invention is significant. Thus, the thickness of the transparent vitreous silica layer 12 may be 0.5 mm or more. This is because, if the thickness of the transparent vitreous silica layer 12 is less than 0.5 mm, the transparent vitreous silica layer 12 may be melted away during the pulling of silicon single crystal to thereby expose the opaque vitreous silica layer 12. In addition, it is unnecessary for the transparent vitreous silica layer 12 to have a uniform thickness from the sidewall part 10A to the bottom part 10B. For example, the transparent vitreous silica layer 12 at the curved part 10C may be greater in thickness than the transparent vitreous silica layer 12 at the sidewall part 10A or the bottom part 10B.

Bubbles in the opaque vitreous silica layer 11 should be distributed in such a way that the content of bubbles having a diameter of less than 40 μm is 10% or more and less than 30%, the content of bubbles having a diameter of 40 μm or more and less than 90 μm is 40% or more and less than 80%, and the content of bubbles having a diameter equal to or more than 90 μm is 10% or more and less than 30%. The above-described diameter distribution of bubbles included in the opaque vitreous silica layer 11 enables to secure the opaque vitreous silica layer's intrinsic functions, warmth retaining property and uniform thermal conductivity. In specific, relatively small bubbles in the opaque vitreous silica layer 11 contribute to the thermal conductivity of the crucible at an initial pulling stage, and relatively large bubbles are expanded through long-term heating during the pulling process to thereby largely contribute to the warmth retaining property of the crucible at a later pulling stage. That is, at the initial stage of pulling silicon single crystals when a great amount of the silicon melt exits in the crucible, the crucible is highly susceptible to heat input due to its high infrared transmittance. At the later pulling stage when the amount of the silicon melt is decreased, the crucible has improved warmth retaining property.

Here, if the content of bubbles contained in the opaque vitreous silica layer 11 which are smaller in diameter than 40 μm is less than 10%, or if the content of bubbles which are equal to or larger than 90 μm is 30% or more, the transmittance is insufficient at the first half pulling stage and thus it takes a long time to melt polysilicon because the opaque vitreous silica layer 11 have more large-diameter bubbles. On the contrary, if the content of bubbles of the opaque vitreous silica layer 11 which are smaller in diameter than 40 μm is 30% or more, or if the content of bubbles which are equal to or larger than 90 μm is less than 10%, the warmth retaining property is insufficient at the later pulling stage, thus making it difficult to control the temperature of the silicon melt in the crucible. Furthermore, if the content of bubbles of the opaque vitreous silica layer 11 having a diameter of 40 μm or more and less than 90 μm is than 40%, both of the problems concurrently occur, i.e., the transmittance is insufficient at the initial pulling stage and the warmth retaining property is insufficient at the later pulling stage.

For these reasons, the opaque vitreous silica layer 11 should have a bubble diameter distribution as follows: the content of bubbles having a diameter of less than 40 µm is 10% or more and less than 30%; the content of bubbles having a diameter of 40 µm or more and less than 90 µm is 40% or more and less than 80%; and the content of bubbles having a diameter equal to or more than 90 µm is 10% or more and less than 30%. In this case, a difference in diameter distribution between bubbles having a diameter less than 40 µm and bubbles having a diameter of 90 µm or more may be less than 10%, preferably less than 5%. When a difference in diameter distribution between bubbles having a diameter less than 40 µm and bubbles having a diameter of 90 µm or more is 10% or more, a balance between a small-diameter bubble content and a large-diameter bubble content becomes worse, degrading one of the thermal conductivity at the initial pulling stage and the warmth retaining property at the later pulling stage. Accordingly, the diameter distribution curve for bubbles included in the opaque vitreous silica layer 11 has a relatively gentle peak in a diameter range of 40 µm to 90 µm.

The diameter distribution of bubbles in the opaque vitreous silica layer 11 may be calculated by observing a cross-section of the opaque vitreous silica layer 11 and specifying diameters of respective bubbles in a unit area through a microscope. An optical detection apparatus used for measuring the bubble content of the transparent vitreous silica layer may also be used to measure the bubble diameter distribution. In this case, the bubble diameter distribution may be calculated by capturing images of bubbles existing to a predetermine depth from the surface while scanning the focus of the optical detection apparatus toward a depth direction from the surface, then processing the captured images in an image processing apparatus, and calculating diameters of the respective bubbles.

The vitreous silica crucible 10 in accordance with the current embodiment may be manufactured according to rotational molding. In the rotational molding, a quartz powder (first quartz powder) used as a raw material of the transparent vitreous silica layer 11 is charged in a rotating carbon mold. The quartz powder used herein is a natural raw material obtained by pulverizing and purifying natural quartz. The opaque vitreous silica layer 11 having the above-described diameter distribution may be formed by selecting an appropriate raw material and adjusting a particle size while considering impurity contents and porosities. Since the carbon mold rotates at a constant speed, the quartz powder charged in the entire mold to a predetermined thickness remains at a fixed position as being adhered to an inner wall by centrifugal force, and maintain its state.

Thereafter, a quartz powder (second quartz powder) used as a raw material of the transparent vitreous silica layer 12 is charged in the carbon mold that has been charged with the quartz powders for the raw material of the opaque vitreous silica layer 11. This quartz powder uses synthetic silica as a raw material, and is charged in the entire mold to a predetermined thickness. Afterwards, arc discharge is performed inside the mold to heat the entire inner surface of the mold charged with the quartz powder at a melting point of silica ($SiO_2$) or more, i.e., approximately 1,700° C. or more and melt the quartz powder. At the same time with the heating, a pressure is reduced in the mold so that a gas inside the quartz is sucked into the outer layer through an air passage formed in the mold and then discharged to the outside. Consequently, the transparent vitreous silica layer 12 not having bubbles substantially is formed by partially removing bubbles existing in the inner surface of the crucible. Thereafter, the opaque vitreous silica layer 11 containing a plurality of micro-bubbles is formed by reducing a pressure slightly and applying heat continuously. Resultantly, the vitreous silica crucible for puling silicon single crystals in accordance with the current embodiment is completed.

Figure 2:
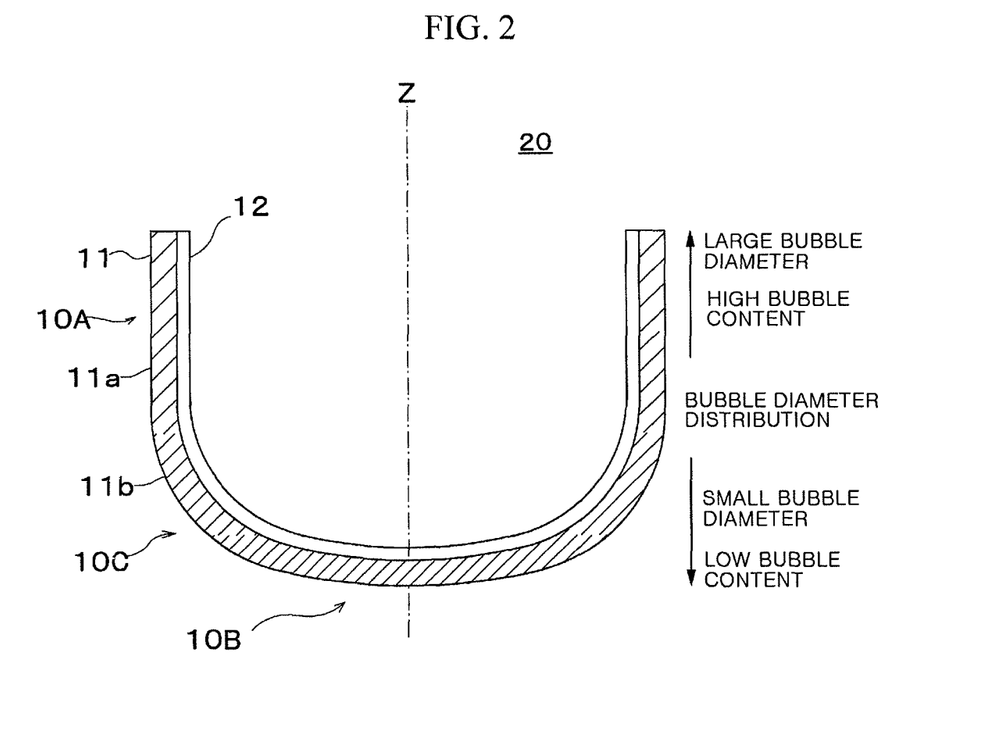
FIG. 2 is a schematic sectional view illustrating a structure of a vitreous silica crucible for pulling silicon single crystals in accordance with another exemplary embodiment.

FIG. 2 is a schematic sectional view illustrating a structure of a vitreous silica crucible for pulling silicon single crystals in accordance with another exemplary embodiment.

A diameter distribution and content of bubbles included in an opaque vitreous silica layer 11 may be differently set according to areas of the crucible. In this case, the opaque vitreous silica layer 11, as illustrated in FIG. 2, may have a bubble diameter distribution in which the number of large-diameter bubbles gradually increases toward a sidewall part 10A from a bottom part 10B, and may have a bubble content increasing toward the sidewall part 10A from the bottom part 10B. That is, the bubble diameter distribution may become smoother from the bottom to the top of the crucible. Accordingly, when comparing the sidewall part 10A and the bottom part 10B of the crucible, the opaque vitreous silica layer 11 may have a bubble diameter distribution in which the opaque vitreous silica layer 11 at the sidewall part 10A of the crucible includes more large-diameter bubbles and higher bubble content than the opaque vitreous silica layer 11 at the bottom part 10B. The bubble diameter distribution and bubble content may be almost linearly changed from the bottom of the crucible toward the top. Alternatively, the bubble diameter distribution and bubble content may be changed in each area or changed hierarchically. In the case where the crucible is constructed in this way, the deformation of the crucible, e.g., crookedness or buckling of crucible, may be substantially reduced, resulting in an increase in single crystallization rate.

Figure 3:
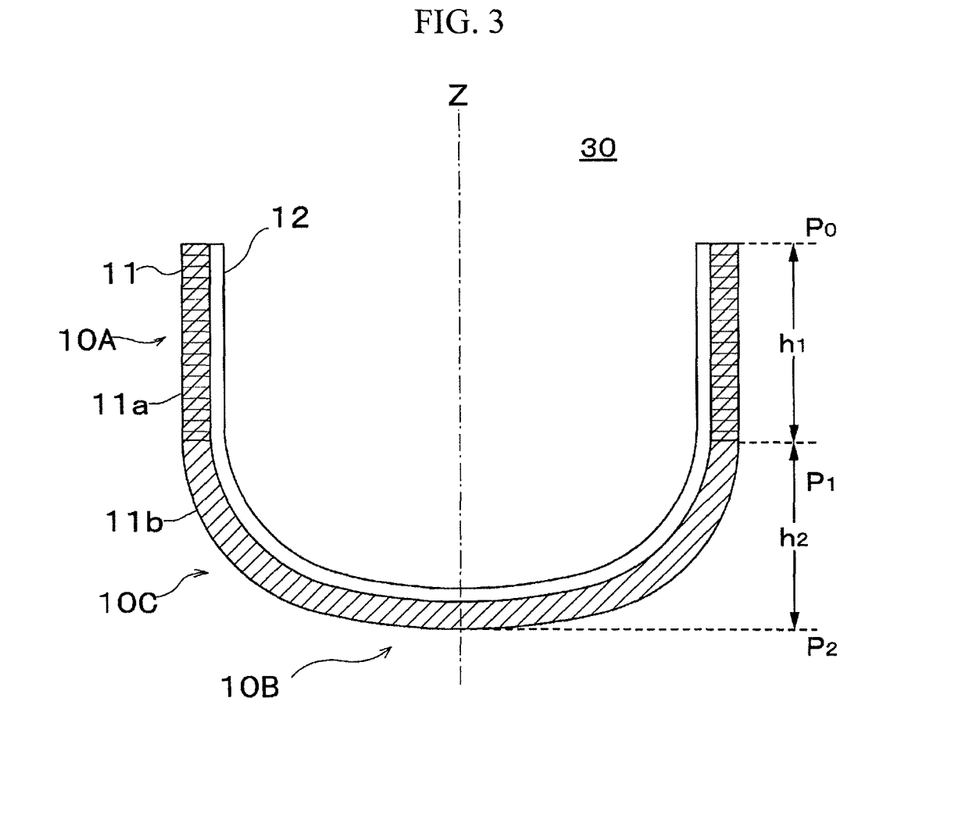
FIG. 3 is a schematic sectional view illustrating a structure of a vitreous silica crucible for pulling silicon single crystals in accordance with still another exemplary embodiment.

FIG. 3 is a schematic sectional view illustrating a structure of a vitreous silica crucible for pulling silicon single crystals in accordance with still another exemplary embodiment.

As illustrated in FIG. 3, a vitreous silica crucible 30 in accordance with the current embodiment includes an opaque vitreous glass layer 11 constituting an outer layer, and a transparent vitreous silica layer 12 constituting an inner layer. Here, the opaque vitreous silica layer 11 includes first and second opaque vitreous silica layers 11a and 11b having different bubble diameter distributions and bubble contents. Specifically, the opaque vitreous silica layer 11 is configured with the first opaque vitreous silica layer 11a formed at an upper part of the crucible and the second opaque vitreous silica layer 11b formed at a lower part of the crucible. Herein, the [upper part of the crucible], which is a part relative to the [lower part of the crucible], is not exactly defined, but may be defined as a part extending from the top position P0 of the crucible to an intermediate position P1. Likewise, the [lower part of the crucible] may be defined as a part extending from the intermediate position P1 to a bottom position P2 of the crucible.

The first opaque vitreous silica layer 11a differs in bubble diameter distribution from the second opaque vitreous silica layer 11b, that is, the first opaque vitreous silica layer 11a includes more large-diameter bubbles than the second opaque vitreous silica layer 11b. The first opaque vitreous silica layer 11a should have a bubble diameter distribution as follows: the content of bubbles having a diameter of less than 40 µm is 10% or more and less than 30%; the content of bubbles having a diameter of 40 µm or more and less than 90 µm is 40% or more and less than 80%; and the content of bubbles having a diameter equal to or more than 90 µm is 10% or more and less than 30%. Likewise, the second opaque vitreous silica layer 11b should also have a bubble diameter distribution as follows: the content of bubbles having a diameter of less than 40 µm is 10% or more and less than 30%; the content of bubbles having a diameter of 40 µm or more and less than 90 µm is 40% or more and less than 80%; and the content of bubbles having a diameter equal to or more than 90 µm is 10% or more and less than 30%. Here, it is required that the second opaque vitreous silica layer 11b is lower in bubble content than the first opaque vitreous silica layer 11a.

For example, the first opaque vitreous silica layer 11a may have such a bubble diameter distribution in which the content of bubbles having a diameter of less than 40 µm is 20%, the content of bubbles having a diameter ranging between 40 µm and 90 µm is 60%, and the content of bubbles having a diameter equal to or more than 90 µm is 20%, and the second opaque vitreous silica layer 11b may have such a bubble diameter distribution in which the content of bubbles having a diameter of less than 40 µm is 15%, the content of bubbles having a diameter ranging between 40 µm and 90 µm is 70%, and the content of bubbles having a diameter equal to or more than 90 µm is 15%.

In the case where the first and second opaque vitreous silica layers 11a and 11b are configured to have the above-described bubble diameter distributions, relatively small bubbles in the first and second opaque vitreous silica layer 11a and 11b contribute to the thermal conductivity of the crucible at an initial pulling stage, and relatively large bubbles are gradually expanded through long-term heating during the pulling process to thereby largely contribute to the warmth retaining property of the crucible at a later pulling stage.

Since the first opaque vitreous silica layer 11a has higher bubble content and more large-diameter bubbles than the second vitreous silica layer 11b, it is possible to reduce the specific gravity of the upper part of the crucible, thereby realizing the crucible to be lightened. This makes it possible to substantially reduce the deformation of the crucible, e.g., crookedness or buckling of the large-diameter crucible with 32 inches in diameter, resulting in an increase in single crystallization rate.

Figure 4:
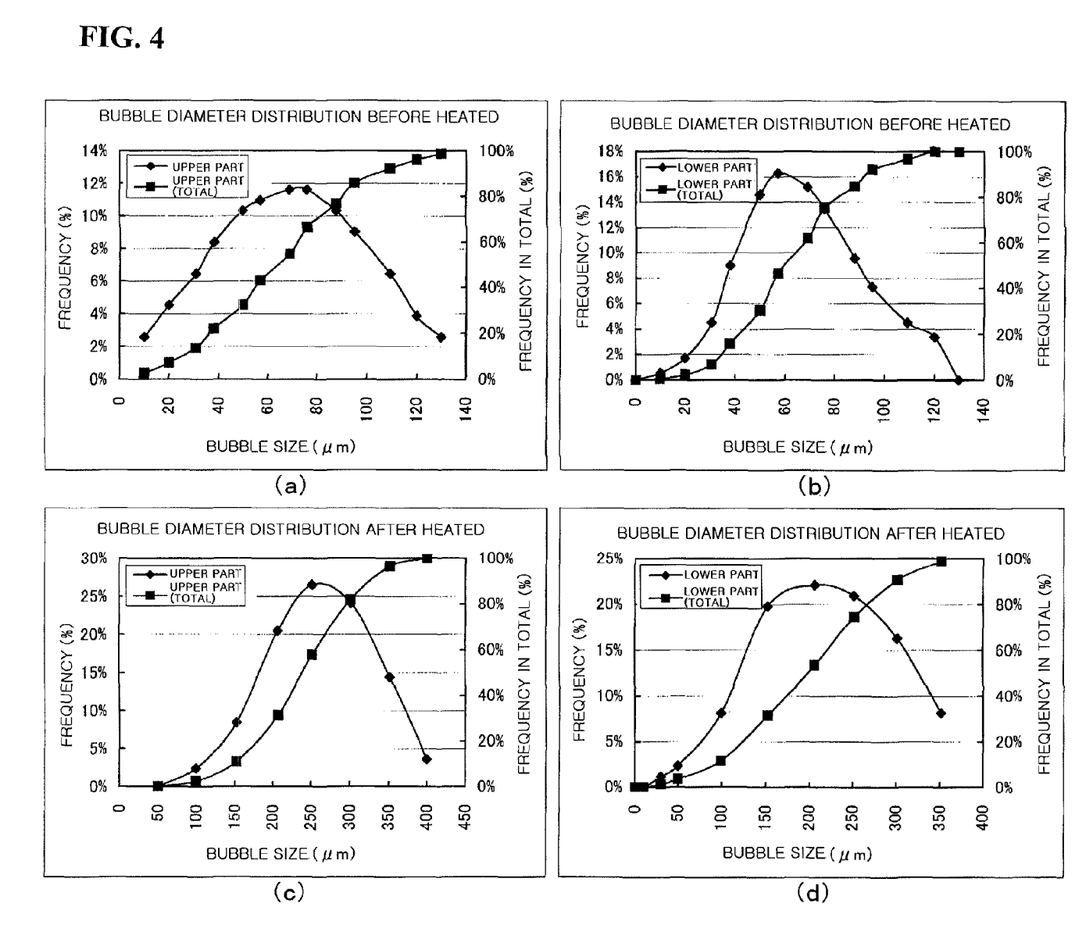
FIG. 4(a) illustrates a bubble diameter distribution in an upper part of a crucible before the crucible is used.
FIG. 4(b) illustrates a bubble diameter distribution in a lower part of the crucible before the crucible is used.
FIG. 4(c) illustrates a bubble diameter distribution in the upper part of the crucible after the crucible is used.
FIG. 4(d) illustrates a bubble diameter distribution in the lower part of the crucible after the crucible is used.

FIGS. 4(a) to 4(d) are graphs showing bubble diameter distributions of the opaque vitreous silica layer 11. FIG. 4(a) illustrates a bubble diameter distribution in an upper part of a crucible before the crucible is used, FIG. 4(b) illustrates a bubble diameter distribution in a lower part of the crucible before the crucible is used, FIG. 4(c) illustrates a bubble diameter distribution in the upper part of the crucible after the crucible is used, and FIG. 4(d) illustrates a bubble diameter distribution in the lower part of the crucible after the crucible is used.

As illustrated in FIGS. 4(a) and (b), it can be understood that the first opaque vitreous silica layer 11a in the upper part of the crucible includes more large-diameter bubbles than the second opaque vitreous silica layer 11b in the lower part of the crucible, whereas the latter includes more small-diameter bubbles than the former. After the vitreous silica crucible having the above-described bubble diameter distribution in the upper and lower parts of the crucible was used to pull up silicon single crystals, the opaque vitreous silica layer has bubble diameter distributions shown in FIGS. 4(c) and (d). That is, bubbles in the lower and upper parts of the crucible are thermally expanded so that relatively small bubbles tend to be decreased but relatively large bubbles tend to be increased. In particular, it can be observed that such a change is dominant in the upper part of the crucible. Therefore, the infrared transmittance can be further increased at the initial stage of pulling silicon single crystals, and the warmth retaining property of the bottom part 10B of the crucible can be further enhanced at the later stage of pulling silicon single crystals. Also, since the opaque vitreous silica layer 11a in the upper part of the crucible includes more large-diameter bubbles than that in the lower part, it is possible to reduce the specific gravity of the upper part of the crucible, thereby realizing the crucible to be lightened.

The vitreous silica crucibles in accordance with the exemplary embodiments of FIGS. 2 and 3 may be manufactured according to rotational molding like the exemplary embodiment of FIG. 1, and differences of bubble diameter distribution and bubble content in the opaque vitreous silica layer may be realized by using two different types of quartz powders in the upper and lower parts of the crucible, respectively.

In the above, while the present invention has been particularly shown and described with reference to the exemplary embodiments, the present invention is not limited to the embodiments herein. Thus, various modifications are possible without departing from the purports of the present invention, and may be included in the present invention.

For example, the exemplary embodiment of FIG. 3 illustrated that the opaque vitreous silica had the double-layered structure having different bubble diameter distributions; however, the opaque vitreous silica layer may have a triple-layered structure.

In the previous embodiments, although the opaque vitreous silica layer 11 was comprised of natural quartz glass and the transparent vitreous silica layer 12 was comprised of synthetic fused silica, the opaque vitreous silica layer 11 needs not be fully comprised of natural quartz glass and a portion of the opaque vitreous silica layer 11 may thus be comprised of synthetic fused silica at an interface between the opaque vitreous silica layer 11 and the transparent vitreous silica layer 12. If the transparent vitreous silica layer 12 is sufficiently thick, a portion of the transparent vitreous silica layer 12 may be comprised of natural quartz glass at an interface between the opaque vitreous silica layer 11 and the transparent vitreous silica layer 12. Alternatively, only natural quartz glass may be used as a raw material without use of synthetic fused silica.

While, in the previous embodiments, the double-layered structure configured with the opaque vitreous silica layer 11 constituting the outer layer and the transparent vitreous silica layer 12 constituting the inner layer is formed on the entire inner surface of the crucible from the sidewall part to the bottom part, the upper part of the crucible may be constituted, for example, by only the opaque vitreous silica layer without using the transparent vitreous silica layer.

EXAMPLES

Example 1

A vitreous silica crucible Al with 32 inches (about 800 mm) in diameter was prepared. As shown in Table 1, a bubble diameter distribution of an opaque vitreous silica layer of the vitreous silica crucible was as follows: the content of bubbles having a diameter of less than 40 µm was 12.1%; the content of bubbles having a diameter of 40 µm or more and less than 90 µm was 72.9%; and the content of bubbles having a diameter equal to or more than 90 µm was 15.0%. The bubble diameter distribution was calculated by observing a cross-section of the vitreous silica crucible prepared using the same raw materials and conditions through a microscope. An infrared transmittance of the vitreous silica crucible before used was measured. The infrared transmittance E was measured in such a manner that an infrared power meter with a heat-receiving area of 1 cm² was installed at a position 30 cm far from an infrared lamp having a wavelength band of 0.5 to 3.5 µm and a peak wavelength of 1.0 µm, a heat-receiving amount C of infrared light was directly measured without insertion of a crucible piece for measurement, then a heat-receiving amount D of infrared light was measured after the crucible piece was inserted in front of a heat-receiving plane, and the infrared transmittance E was calculated from E=(D/C)×100 [%]. As a result, an average infrared transmittance of the sidewall part, curved part and bottom part of the crucible was 63.8%.

Thereafter, polysilicon broken pieces with 300 kg in weight was charged in the vitreous silica crucible, and the vitreous silica crucible was then loaded into a single-crystal pulling apparatus. The polysilicon in the crucible is melted in a furnace, and a silicon single crystal ingot with about 300 mm in diameter was then pulled up.

Afterwards, an infrared transmittance of the vitreous silica crucible after used was measured. Also, the single crystallization rate of the silicon single crystal that has been pulled up was measured. The single crystallization rate is defined as a ratio of an amount of silicon single crystal to an amount of the raw material polysilicon in weight percent. Since the whole silicon melt in the crucible is not used and only a straight trunk portion except for a top portion and a tail portion of the silicon single crystal is considered for measuring the single crystallization rate, the single crystallization rate is less than 100% even if the silicon single crystal is sufficiently pulled up. If the single crystallization rate is 80% or more, the pulling of single crystal is good.

As shown in Table 1, the average infrared transmittance of the sidewall part, curved part and bottom part of the sample A1 of the vitreous silica crucible after used was 32.1%. The single crystallization rate of the silicon single crystal pulled by using the sample A1 of the vitreous silica crucible in accordance with the current embodiment was 82%. From these results, it can be understood that the infrared transmittance of the sample A1 of the vitreous silica crucible was significantly changed to 32.1% from 63.8% after the vitreous silica crucible was used, and resultantly, good single crystallization rate could be obtained.

used was measured. An average infrared transmittance of the sidewall part, curved part and bottom part of the crucible was 63.0%.

Thereafter, a silicon single crystal ingot was pulled up under the same conditions of Example 1, and then an infrared transmittance of the vitreous silica crucible after used was measured. As shown in Table 1, an average infrared transmittance of the sidewall part, curved part and bottom part of the crucible was 29.9% after the crucible was used. Also, the single crystallization rate of the silicon single crystal that has been pulled up was measured to be 83%. Like Example 1, it can be understood from these results that the infrared transmittance of the sample A2 was significantly changed after the vitreous silica crucible was used, and resultantly, good single crystallization rate could be obtained.

Example 3

A sample A3 of a vitreous silica crucible with 40 inches (about 1,000 mm) in diameter was prepared. As shown in Table 1, a bubble diameter distribution of an opaque vitreous silica layer of the vitreous silica crucible was as follows: the content of bubbles having a diameter of less than 40 μm was 13.3%; the content of bubbles having a diameter of 40 μm or more and less than 90 μm was 68.8%; and the content of bubbles having a diameter equal to or more than 90 μm was 17.9%. An infrared transmittance of the vitreous silica crucible before used was measured. An average infrared transmittance of the sidewall part, curved part and bottom part of the crucible was 61.4%.

Thereafter, a silicon single crystal ingot was pulled up under the same conditions of Example 1, and then an infrared transmittance of the vitreous silica crucible after used was measured. As shown in Table 1, an average infrared transmittance of the sidewall part, curved part and bottom part of the crucible was 28.7% after the crucible was used. Also, the single crystallization rate of the silicon single crystal that has

TABLE 1

| | | Examples | | | | | | | | | Comparative Examples | | |
|---|---|---|---|---|---|---|---|---|---|---|---|---|---|
| | | 1 | 2 | 3 | 4 | | 5 | | | 6 | | 1 | 2 | 3 |
| Size of Crucible | | 32" | 36" | 40" | 32" | | 32" | | | 32" | | 32" | 36" | 40" |
| Part of Crucible | | All | All | All | Upper Part | Lower Part | Side-wall Part | Bottom Part | Side-wall Part | Curved part | Bottom Part | All | All | All |
| Bubble Diameter Distribution of Opaque Layer (%) | <40 μm | 12.1 | 16.4 | 13.3 | 22.6 | 15.8 | 28.1 | 16.6 | 25.6 | 22.7 | 14.1 | 9.6 | 7.9 | 9.5 |
| | 40≤ & <90 μm | 72.9 | 69.2 | 68.8 | 54.3 | 69.1 | 45.5 | 68.9 | 49.5 | 58.1 | 71.7 | 84.1 | 88.2 | 85.6 |
| | 90 μm≤ | 15.0 | 14.4 | 17.9 | 23.1 | 15.1 | 26.4 | 14.5 | 24.9 | 19.2 | 14.2 | 6.3 | 3.9 | 4.9 |
| Average IR Transmittance of Sidewall Part, Bottom Part, and Curved part (%) | Before used | 63.8 | 63.0 | 61.4 | 61.4 | | 60.7 | | | 61.8 | | 49.4 | 46.1 | 44.2 |
| | After used | 32.1 | 29.9 | 28.7 | 30.4 | | 29.5 | | | 28.1 | | 37.2 | 35.8 | 34.3 |
| Single Crystallization rate (%) | | 82 | 83 | 82 | 89 | | 88 | | | 88 | | 56 | 59 | 62 |

Example 2

A sample A2 of a vitreous silica crucible with 36 inches (about 900 mm) in diameter was prepared. As shown in Table 1, a bubble diameter distribution of an opaque vitreous silica layer of the vitreous silica crucible was as follows: the content of bubbles having a diameter of less than 40 μm was 16.4%; the content of bubbles having a diameter of 40 μm or more and less than 90 μm was 69.2%; and the content of bubbles having a diameter equal to or more than 90 μm was 14.4%. An infrared transmittance of the vitreous silica crucible before been pulled up was measured to be 82%. Like Examples 1 and 2, it can be understood from these results that the infrared transmittance of the sample A3 was significantly changed after the vitreous silica crucible was used, and resultantly, good single crystallization rate could be obtained.

Example 4

A sample A4 of a vitreous silica crucible with 32 inches (about 800 mm) in diameter was prepared. In the vitreous silica crucible of Example 4, an opaque vitreous silica layer at an upper part differs in bubble diameter distribution from an opaque vitreous silica layer at a lower part of this vitreous silica crucible. As shown in Table 1, a bubble diameter distribution of the opaque vitreous silica layer at the upper part of the vitreous silica crucible was as follows: the content of bubbles having a diameter of less than 40 µm was 22.6%; the content of bubbles having a diameter of 40 µm or more and less than 90 µm was 54.3%; and the content of bubbles having a diameter equal to or more than 90 µm was 23.1%. In addition, a bubble diameter distribution of the opaque vitreous silica layer at the lower part of the vitreous silica crucible was as follows: the content of bubbles having a diameter of less than 40 µm was 15.8%; the content of bubbles having a diameter of 40 µm or more and less than 90 µm was 69.1%; and the content of bubbles having a diameter equal to or more than 90 µm was 15.1%. An infrared transmittance of the vitreous silica crucible before used was measured. An average infrared transmittance of the sidewall part, curved part and bottom part of the crucible was 61.4%.

Thereafter, a silicon single crystal ingot was pulled up under the same conditions of Example 1, and then an infrared transmittance of the vitreous silica crucible was measured after the crucible was used. As shown in Table 1, an average infrared transmittance of the sidewall part, curved part and bottom part of the crucible was 30.4%. Also, the single crystallization rate of the silicon single crystal that has been pulled up was measured to be 89%. Like Examples 1 to 3, it can be understood from these results that the infrared transmittance of the sample A4 was significantly changed after the vitreous silica crucible was used, and resultantly, good single crystallization rate could be obtained. Furthermore, it can be understood that the vitreous silica crucible of Example 4 can provide higher single crystallization rate than those of Examples 1 to 3 by 5% or more because the deformation of the crucible can be substantially reduced in spite of the long-term pulling process.

Example 5

A sample A5 of a vitreous silica crucible with 32 inches (about 800 mm) in diameter was prepared. In the vitreous silica crucible of Example 5, an opaque vitreous silica layer at a sidewall part differs in bubble diameter distribution from an opaque vitreous silica layer at a bottom part of this vitreous silica crucible. As shown in Table 1, a bubble diameter distribution of the opaque vitreous silica layer at the sidewall part of the vitreous silica crucible was as follows: the content of bubbles having a diameter of less than 40 µm was 28.1%; the content of bubbles having a diameter of 40 µm or more and less than 90 µm was 45.5%; and the content of bubbles having a diameter equal to or more than 90 µm was 26.4%. In addition, a bubble diameter distribution of the opaque vitreous silica layer at the bottom part of the vitreous silica crucible was as follows: the content of bubbles having a diameter of less than 40 µm was 16.6%; the content of bubbles having a diameter of 40 µm or more and less than 90 µm was 68.9%; and the content of bubbles having a diameter equal to or more than 90 µm was 14.5%. An infrared transmittance of the vitreous silica crucible before used was measured. An average infrared transmittance of the sidewall part, curved part and bottom part of the crucible was 60.7%.

Thereafter, a silicon single crystal ingot was pulled up under the same conditions of Example 1, and then an infrared transmittance of the vitreous silica crucible was measured after the crucible was used. As shown in Table 1, an average infrared transmittance of the sidewall part, curved part and bottom part of the crucible was 29.5%. Also, the single crystallization rate of the silicon single crystal that has been pulled up was measured to be 88%. Like Examples 1 to 4, it can be understood from these results that the infrared transmittance of the sample A5 was significantly changed after the vitreous silica crucible was used, and resultantly, good single crystallization rate could be obtained. Furthermore, it can be understood that the vitreous silica crucible of Example 5 can provide higher single crystallization rate than those of Examples 1 to 3 by 5% or more because the deformation of the crucible can be substantially reduced in spite of the long-term pulling process.

Example 6

A sample A6 of a vitreous silica crucible with 32 inches (about 800 mm) in diameter was prepared. In this vitreous silica crucible of Example 6, opaque vitreous silica layers at a sidewall part, a curved part and a bottom part differs in bubble diameter distribution from one another. As shown in Table 1, a bubble diameter distribution of the opaque vitreous silica layer at the sidewall part of the vitreous silica crucible was as follows: the content of bubbles having a diameter of less than 40 µm was 25.6%; the content of bubbles having a diameter of 40 µm or more and less than 90 µm was 49.5%; and the content of bubbles having a diameter equal to or more than 90 µm was 24.9%. In addition, a bubble diameter distribution of the opaque vitreous silica layer at the curved part of the vitreous silica crucible was as follows: the content of bubbles having a diameter of less than 40 µm was 22.7%; the content of bubbles having a diameter of 40 µm or more and less than 90 µm was 58.1%; and the content of bubbles having a diameter equal to or more than 90 µm was 19.2%. Furthermore, a bubble diameter distribution of the opaque vitreous silica layer at the bottom part of the vitreous silica crucible was as follows: the content of bubbles having a diameter of less than 40 µm was 14.1%; the content of bubbles having a diameter of 40 µm or more and less than 90 µm was 71.7%; and the content of bubbles having a diameter equal to or more than 90 µm was 14.2%. An infrared transmittance of the vitreous silica crucible before used was measured. An average infrared transmittance of the sidewall part, curved part and bottom part of the crucible was 61.8%.

Thereafter, a silicon single crystal ingot was pulled up under the same conditions of Example 1, and then an infrared transmittance of the vitreous silica crucible was measured after the crucible was used. As shown in Table 1, an average infrared transmittance of the sidewall part, curved part and bottom part of the crucible was 28.1%. Also, the single crystallization rate of the silicon single crystal that has been pulled up was measured to be 88%. Like Examples 1 to 5, it can be understood from these results that the infrared transmittance of the sample A6 was significantly changed after the vitreous silica crucible was used, and resultantly, good single crystallization rate could be obtained. Furthermore, it can be understood that the vitreous silica crucible of Example 6 can provide higher single crystallization rate than those of Examples 1 to 3 by 5% or more because the deformation of the crucible can be substantially reduced in spite of the long-term pulling process.

Comparative Example 1

A sample B1 of a vitreous silica crucible with 32 inches in diameter was prepared. As shown in Table 1, a bubble diameter distribution of an opaque vitreous silica layer of the vitreous silica crucible was as follows: the content of bubbles having a diameter of less than 40 µm was 9.6%; the content of bubbles having a diameter of 40 μm or more and less than 90 μm was 84.1%; and the content of bubbles having a diameter equal to or more than 90 μm was 6.3%. An infrared transmittance of the vitreous silica crucible before used was measured. An average infrared transmittance of the sidewall part, curved part and bottom part of the crucible was 49.4%.

Thereafter, a silicon single crystal ingot was pulled up under the same conditions of Example 1, and then an infrared transmittance of the vitreous silica crucible after the crucible was used was measured. As shown in Table 1, an average infrared transmittance of the sidewall part, curved part and bottom part of the crucible was 37.2%. Also, the single crystallization rate of the silicon single crystal that has been pulled up was measured to be 56%. That is, the single crystallization rate was significantly decreased. From these results, the infrared transmittance of the sample B1 of the vitreous silica crucible prepared by Comparative Example 1 was slightly changed to 37.2% from 49.4% after the vitreous silica crucible was used, however, a difference in infrared transmittance before and after the crucible was used is small compared to Examples 1 to 3. Resultantly, it was verified that it was difficult to achieve good single crystallization rate.

Comparative Example 2

A sample B2 of a vitreous silica crucible with 36 inches in diameter was prepared. As shown in Table 1, a bubble diameter distribution of an opaque vitreous silica layer of the vitreous silica crucible was as follows: the content of bubbles having a diameter of less than 40 μm was 7.9%; the content of bubbles having a diameter of 40 μm or more and less than 90 μm was 88.2%; and the content of bubbles having a diameter equal to or more than 90 μm was 3.9%. An infrared transmittance of the vitreous silica crucible before used was measured. An average infrared transmittance of the sidewall part, curved part and bottom part of the crucible was 46.1%.

Thereafter, a silicon single crystal ingot was pulled up under the same conditions of Example 1, and then an infrared transmittance of the vitreous silica crucible after the crucible was used was measured. As shown in Table 1, an average infrared transmittance of the sidewall part, curved part and bottom part of the crucible was 35.8%. Also, the single crystallization rate of the silicon single crystal that has been pulled up was measured to be 59%. That is, the single crystallization rate was significantly decreased. Like Comparative Example 1, the infrared transmittance of the vitreous silica crucible prepared was not greatly changed before and after the crucible was used, and resultantly, it was verified that it was difficult to achieve good single crystallization rate.

Comparative Example 3

A sample B3 of a vitreous silica crucible with 40 inches in diameter was prepared. As shown in Table 1, a bubble diameter distribution of an opaque vitreous silica layer of the vitreous silica crucible was as follows: the content of bubbles having a diameter of less than 40 μm was 9.5%; the content of bubbles having a diameter of 40 μm or more and less than 90 μm was 85.6%; and the content of bubbles having a diameter equal to or more than 90 μm was 4.9%. An infrared transmittance of the vitreous silica crucible before used was measured. An average infrared transmittance of the sidewall part, curved part and bottom part of the crucible was 44.2%.

Thereafter, a silicon single crystal ingot was pulled up under the same conditions of Example 1, and then an infrared transmittance of the vitreous silica crucible after the crucible was used was measured. As shown in Table 1, an average infrared transmittance of the sidewall part, curved part and bottom part of the crucible was 34.3%. Also, the single crystallization rate of the silicon single crystal that has been pulled up was measured to be 62%. That is, the single crystallization rate was significantly decreased. Like Comparative Examples 1 and 2, the infrared transmittance of the vitreous silica crucible prepared was not greatly changed before and after the crucible was used, and resultantly, it was verified that it was difficult to achieve good single crystallization rate.

As set forth above, in accordance with the previous embodiments, it is possible to provide a vitreous silica crucible for pulling silicon single crystal, which can allow a silicon raw material to be melted in a short time and improve production yield of silicon single crystals by a temporal change of an opaque vitreous silica layer.

Although the vitreous silica crucible for pulling silicon single crystal has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A vitreous silica crucible having a sidewall part, a curved part and a bottom part, for pulling silicon single crystals, the vitreous silica crucible comprising:
   a transparent vitreous silica layer provided on an inner surface of the crucible; and
   an opaque vitreous silica layer provided on an outer surface of the crucible, and including a plurality of bubbles,
   wherein:
   a bubble content of the transparent vitreous silica layer is 0.1% or less and the opaque vitreous silica layer is higher in bubble content than the transparent vitreous silica layer,
   the opaque vitreous silica layer has a bubble diameter distribution in which the content of bubbles having a diameter of less than 40 is 10% or more and less than 30%, the content of bubbles having a diameter of 40 or more and less than 90 is 40% or more and less than 80%, and the content of bubbles having a diameter of 90 or more is 10% or more and less than 30%,
   the vitreous silica crucible is rotationally molded, and
   the rotational molding includes performing arc discharge after charging the quartz powder used as a raw material of the transparent vitreous silica layer in a rotating carbon mold, and further includes reducing a pressure in the mold so that a gas inside the quartz is sucked into the outer layer through an air passage formed in the mold and then discharged to the outside.

2. The vitreous silica crucible of claim 1, wherein the opaque vitreous silica layer at an upper part of the crucible has, compared with the opaque vitreous silica layer at a lower part of the crucible, a diameter distribution in which more large-diameter bubbles are included and a higher bubble content.

3. The vitreous silica crucible of claim 1, wherein the opaque vitreous silica layer at the sidewall part of the crucible has, compared with the opaque vitreous silica layer at the bottom part of the crucible, a diameter distribution in which more large-diameter bubbles are included and a higher bubble content.

4. The vitreous silica crucible of claim 1, wherein the opaque vitreous silica layer has a bubble diameter distribution in which the number of large-diameter bubbles increases from the bottom part toward the sidewall part, and has a bubble content increasing from the bottom part toward the sidewall part.

5. A vitreous silica crucible having:
- a sidewall part;
- a curved part;
- a bottom part;
- a transparent vitreous silica layer provided on an inner surface of the crucible; and
- an opaque vitreous silica layer provided on an outer surface of the crucible, and including a plurality of bubbles, wherein:
- a bubble content of the transparent vitreous silica layer is 0.1% or less and the opaque vitreous silica layer is higher in bubble content than the transparent vitreous silica layer,
- the opaque vitreous silica layer has a bubble diameter distribution in which the content of bubbles having a diameter of less than 40 µm is 10% or more and less than 30%, the content of bubbles having a diameter of 40 µm or more and less than 90 µm is 40% or more and less than 80%, and the content of bubbles having a diameter of 90 µm or more is 10% or more and less than 30%, the crucible produced by the following method:

charging quartz powder used as a raw material of the opaque vitreous silica layer in a rotating mold and then charging quartz powder used as a raw material of the transparent vitreous silica layer in the rotating mold that has been charged with the quartz powders for the raw material of the opaque vitreous silica layer;

performing arc discharge inside the mold to heat the entire inner surface of the mold charged with the quartz powder; and reducing a pressure in the mold so that a gas inside the quartz is sucked into the outer layer through an air passage formed in the mold and then discharged to the outside.

* * * * *